US011440850B2

(12) United States Patent
Yasui et al.

(10) Patent No.: US 11,440,850 B2
(45) Date of Patent: Sep. 13, 2022

(54) POWDER FOR ADDITIVE MODELING, STRUCTURE, SEMICONDUCTOR PRODUCTION DEVICE COMPONENT, AND SEMICONDUCTOR PRODUCTION DEVICE

(71) Applicant: CANON KABUSHIKI KAISHA, Tokyo (JP)

(72) Inventors: Nobuhiro Yasui, Yokohama (JP); Hisato Yabuta, Machida (JP); Kanako Oshima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/936,761

(22) Filed: Jul. 23, 2020

(65) Prior Publication Data

US 2020/0346982 A1 Nov. 5, 2020

Related U.S. Application Data

(62) Division of application No. 16/178,884, filed on Nov. 2, 2018, now Pat. No. 10,759,712.

(30) Foreign Application Priority Data

Nov. 9, 2017 (JP) .............................. JP2017-216031
Oct. 31, 2018 (JP) .............................. JP2018-205584

(51) Int. Cl.
*C04B 35/582* (2006.01)
*C04B 35/5835* (2006.01)
(Continued)

(52) U.S. Cl.
CPC .............. *C04B 35/64* (2013.01); *B22F 10/20* (2021.01); *B28B 1/001* (2013.01); *B33Y 10/00* (2014.12);
(Continued)

(58) Field of Classification Search
CPC . C04B 35/581; C04B 35/583; C04B 35/5831; C04B 35/587; C04B 35/591; C04B 35/593; B33Y 80/00
See application file for complete search history.

(56) References Cited

U.S. PATENT DOCUMENTS 5,188,781 A ‡ 2/1993 Peuckert ............... C04B 35/584
264/665
5,214,005 A ‡ 5/1993 Yamakawa ........... C03C 14/004
257/E23.009
(Continued)

FOREIGN PATENT DOCUMENTS

CN 106904977 A ‡ 6/2017
JP 62171964 A * 7/1987
(Continued)

OTHER PUBLICATIONS

Definition of Eutectic, Britannica. (Year: 2022).*
(Continued)

*Primary Examiner* — Karl E Group
(74) *Attorney, Agent, or Firm* — Venable LLP

(57) ABSTRACT

A material powder for additive modeling including a nitride, and a eutectic oxide, the nitride having an average density lower than an average density of the eutectic oxide, is used to produce a structure using an additive modeling method.

12 Claims, 2 Drawing Sheets

(51) Int. Cl.

| | | |
|---|---|---|
| C04B 35/596 | (2006.01) | |
| C04B 35/58 | (2006.01) | |
| B33Y 80/00 | (2015.01) | |
| C04B 35/64 | (2006.01) | |
| B28B 1/00 | (2006.01) | |
| B33Y 70/00 | (2020.01) | |
| B33Y 10/00 | (2015.01) | |
| C04B 35/653 | (2006.01) | |
| C04B 35/117 | (2006.01) | |
| G03F 1/00 | (2012.01) | |
| C04B 35/581 | (2006.01) | |
| C04B 35/50 | (2006.01) | |
| B22F 10/20 | (2021.01) | |

(52) U.S. Cl.
CPC ............ *B33Y 70/00* (2014.12); *B33Y 80/00* (2014.12); *C04B 35/117* (2013.01); *C04B 35/50* (2013.01); *C04B 35/581* (2013.01); *C04B 35/653* (2013.01); *G03F 1/00* (2013.01); *B22F 2302/20* (2013.01); *B22F 2302/253* (2013.01); *C04B 2235/3217* (2013.01); *C04B 2235/3224* (2013.01); *C04B 2235/386* (2013.01); *C04B 2235/3865* (2013.01); *C04B 2235/3873* (2013.01); *C04B 2235/5436* (2013.01); *C04B 2235/6026* (2013.01); *C04B 2235/665* (2013.01); *C04B 2235/77* (2013.01)

(56) References Cited

U.S. PATENT DOCUMENTS

| | | | | |
|---|---|---|---|---|
| 5,439,853 | A * | 8/1995 | Omori | ............ C04B 35/18 501/89 |
| 5,631,200 | A ‡ | 5/1997 | Ukegawa | ............ C04B 35/5935 501/97.2 |
| 6,225,249 | B1 * | 5/2001 | Fujita | ............ C04B 35/581 264/653 |
| 6,630,417 | B2 * | 10/2003 | Kawai | ............ C03C 3/087 501/16 |
| 7,157,394 | B2 * | 1/2007 | Adams, Sr. | ......... C04B 35/6261 501/97.2 |
| 7,309,672 | B2 ‡ | 12/2007 | Mikijelj | ............... C04B 35/563 501/87 |
| 9,212,085 | B2 ‡ | 12/2015 | Yano | ................. C03C 10/0045 |
| 9,212,087 | B2 ‡ | 12/2015 | Yano | ...................... C03C 3/091 |
| 2002/0094929 | A1 ‡ | 7/2002 | Kawai | .................. C03C 14/004 501/32 |
| 2003/0100434 | A1 ‡ | 5/2003 | Yoshitomi | ............. B82Y 30/00 501/87 |
| 2006/0014625 | A1 * | 1/2006 | Adams, Sr. | ........... C04B 35/593 501/97.2 |
| 2006/0163605 | A1 | 7/2006 | Miyahara | |
| 2006/0183625 | A1 | 8/2006 | Miyahara | |
| 2007/0010391 | A1 ‡ | 1/2007 | Mikijelj | ................. C04B 35/563 501/87 |
| 2008/0171647 | A1 ‡ | 7/2008 | Lee | ....................... C04B 35/117 501/32 |
| 2013/0157445 | A1 * | 6/2013 | Miyashita | ........... H01L 21/0254 438/478 |
| 2019/0134893 | A1 | 5/2019 | Yabuta et al. | |
| 2019/0300441 | A1 | 10/2019 | Kubota et al. | |

FOREIGN PATENT DOCUMENTS

| | | |
|---|---|---|
| JP | 2006-290729 A | 10/2006 |
| JP | 2011-225446 A | 11/2011 |
| JP | 2013-501701 A | 1/2013 |
| JP | 2015-514661 A | 5/2015 |
| WO | 2011/018463 A1 | 2/2011 |
| WO | 2013/130918 A1 | 9/2013 |

OTHER PUBLICATIONS

Yves-Christian Hagedorn et al., "Net Shaped High Performance Oxide Ceramic Parts by Selective Laser Melting," 5 Physics Procedia 587-594 (2010).‡

Notice of Reasons for Refusal in Japanese Application No. 2018-205584 (dated Jul. 2022).

* cited by examiner

‡ imported from a related application

POWDER FOR ADDITIVE MODELING, STRUCTURE, SEMICONDUCTOR PRODUCTION DEVICE COMPONENT, AND SEMICONDUCTOR PRODUCTION DEVICE

CROSS-REFERENCE TO RELATED APPLICATIONS

This application is a divisional application of U.S. patent application Ser. No. 16/178,884, filed Nov. 2, 2018, now U.S. Pat. No. 10,759,712, which claims the benefit of Japanese Patent Application No. 2017-216031, filed Nov. 9, 2017, and Japanese Patent Application No. 2018-205584, filed Oct. 31, 2018. All of these prior applications are hereby incorporated by reference herein in their entirety.

BACKGROUND OF THE INVENTION

Field of the Invention

The present invention relates to a powder for additive modeling for preparing a structure made of a ceramic using an additive modeling method, a structure using the powder for additive modeling, a semiconductor production device component, and a semiconductor production device using the component.

Description of the Related Art

In recent years, additive modeling techniques have been extended, and in particular, various structures are prepared by a powder bed fusion method (powder bed laser direct modeling system) using a metal powder. In the powder bed fusion method, the powder of a material is effectively melted and becomes a solidification structure group, and therefore a dense structure can be obtained. In such a circumstance, the development of the powder bed fusion method to ceramic modeling has been discussed, and many efforts have been reported. In order to melt ceramic powder in a similar manner as in a metal powder, appropriate energy is required to be applied. In addition, unlike a metal, a ceramic powder does not melt homogeneously due to the light diffusion inside the powder, and it is difficult to obtain the modeling accuracy.

In Physics Procedia 5 (2010) 587-594, a technique of realizing a structure that is accurate and excellent in the mechanical strength by reducing a melting point with the use of an $Al_2O_3$—$ZrO_2$ eutectic system and by forming a microstructure peculiar to the eutectic system at the time of melting and solidification has been proposed.

One of the modeling shapes formed favorably by an additive modeling technique is a hollow shape. For a semiconductor exposure device having a driving mechanism, a stage component made of a ceramic having a hollow structure, such as a vacuum chuck made of $Al_2O_3$ is used. Therefore, for modeling the stage component, an additive modeling technique using a ceramic powder is suitable. The stage component is driven at a high speed, and therefore, high specific rigidity (Young's modulus [GPa]/specific gravity) has been demanded.

SUMMARY OF THE INVENTION

An aspect of the present invention is a material powder for additive modeling including a nitride, and a eutectic oxide, the nitride having an average density lower than an average density of the eutectic oxide.

In addition, another aspect of the present invention is a structure constituted of a ceramic, and includes polycrystalline nitride particles having an average diameter of 5 µm or more, and an oxide region forming a eutectic structure including the polycrystalline nitride particle.

In addition, still another aspect of the present invention is a method of producing a structure constituted of a ceramic including: preparing a powder containing a nitride particle and a particle containing a eutectic oxide; constituting a powder layer including the powder; and irradiating the powder layer with an energy beam according to shape data of a three-dimensional model, the powder layer being irradiated with the energy beam so that a temperature of an irradiation portion of the energy beam is less than or equal to a decomposition temperature of the nitride particle.

Further features of the present invention will become apparent from the following description of exemplary embodiments with reference to the attached drawings.

DESCRIPTION OF THE EMBODIMENTS

Hereinafter, embodiments for carrying out the present invention will be described with reference to the drawings or the like.

A first aspect of the present invention is a powder for additive modeling that is used in production of a structure (modeled object) made of a ceramic, and can be used in a powder bed fusion method or a cladding method, in which irradiation with an energy beam (laser beam, electron beam, or the like) is performed for the modeling. Hereinafter, as an example, a process using a laser beam will be described with reference to the drawings.

As the laser beam used for modeling, a laser beam containing a light having a wavelength at which the composition contained in a powder for modeling has absorption capability is preferable, and a laser beam adjusted to a desired focal point size of 10 µm to 2 mm or the like with a lens or a fiber is preferably used. The focal point size is one of the parameters that affect the modeling accuracy, and in order to satisfy the modeling accuracy with a surface roughness Ra of 0.1 mm or less on a structure surface, the focal point size is preferably 100 µm or less although depending on the situation. When the Ra of a structure is 0.1 mm or less, a complicated three-dimensional structure can be modeled. In addition, the laser beam may be a continuous laser beam or a pulsed laser beam. As an example, the laser beam is an Nd:YAG laser, and the wavelength is in the vicinity of 1070 nm.

Figure 1:
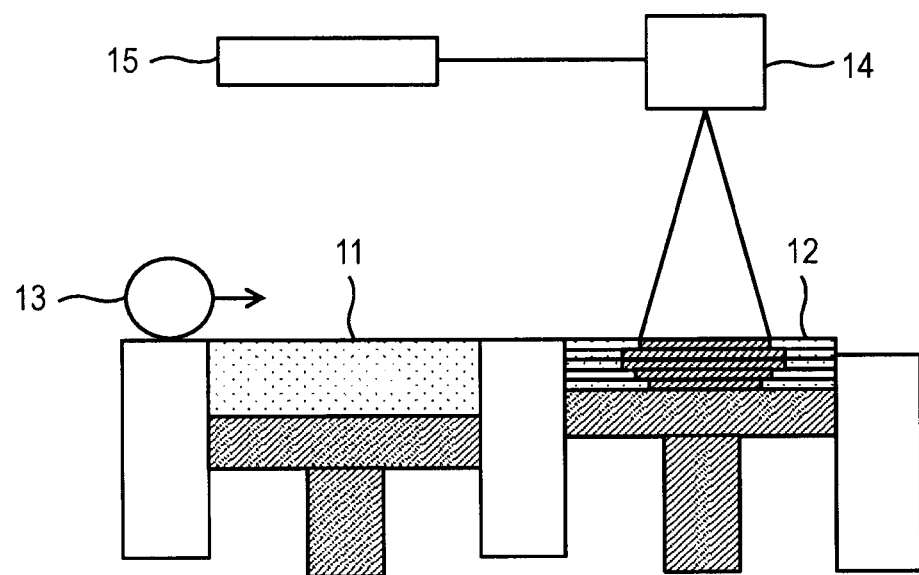
FIG. 1 is a diagram showing an example of a modeling technique to which the powder according to the present invention can be applied.

FIG. 1 shows an example of a modeling device used in a powder bed fusion method. The modeling device is provided with a powder box 11, a modeling stage unit 12, a recoater unit 13, a scanner unit 14, and a laser 15. In the modeling operation, a powder is manipulated by a recoater unit 13 while a powder box 11 and a modeling stage unit 12 are appropriately moved up and down, and the powder is thinly spread and leveled off over an area wider than that of the structure assumed. In addition, sintering, melting, and solidification are generated by directly processing a certain cross-sectional shape of a structure to a powder layer by a laser 15 and a scanner unit 14, and by repeating this process, the lamination proceeds, and thus a structure (modeled object) is prepared.

Figure 2:
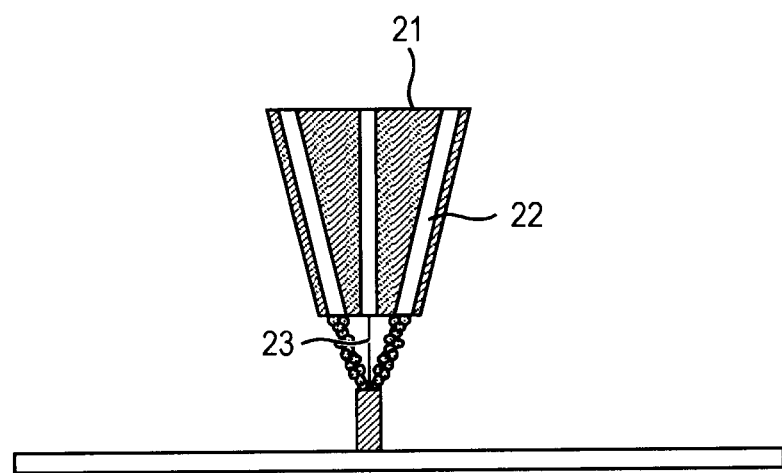
FIG. 2 is a diagram showing an example of a modeling technique to which the powder according to the present invention can be applied.

A part of the modeling device used in a cladding method is shown in FIG. 2. A powder is ejected from multiple powder supply holes 22 arranged in a cladding nozzle 21 and supplied to a focal position of a laser 23, and while melting the powder, the molten material is added to a desired place to prepare a structure. A curved surface or the like can also be modeled by the cladding method.

Next, a composition and a powder, relating to the powder for additive modeling according to the present invention, and a structure obtained by using the powder for additive modeling according to the present invention will be described.

The term "powder" as employed herein refers to as an aggregate of particles that can be recognized to be isolated grains. The term "composition" as employed herein refers to as a basic element of the material constituting the whole powder, and is in a single state as an element or compound but not in a form of grains, and the powder including a composition group.

Composition

The material powder for additive modeling according to the present invention includes a eutectic oxide, and a nitride having a density lower than the average density of the eutectic oxide. Further, as necessary for the modeling, it is preferred to further include a composition (absorber) that is responsible for the absorption of a laser beam. There is no limitation on the kind of the nitride as long as the density of the nitride is lower than the average density of the eutectic oxide. For example, boron nitride (h-BN, density: 2.27 $g/cm^3$), aluminum nitride (AlN, density: 3.26 $g/cm^3$), silicon nitride ($Si_3N_4$, density: 3.44 $g/cm^3$), titanium nitride (TiN, density: 5.22 $g/cm^3$), vanadium nitride (VN, density: 6.13 $g/cm^3$), chromium nitride ($Cr_2N$, density: 6.51 $g/cm^3$), zirconium nitride (ZrN, density: 7.09 $g/cm^3$), niobium nitride (NbN, density: 8.47 $g/cm^3$), tantalum nitride (TaN, density: 14.36 $g/cm^3$), and the like can be mentioned. The numerical values described here are approximate, and some numerical difference due to the difference in the calculation method is not a problem. In addition, the ratio of nitrogen to the metal element is not also necessary to be only the exact ratio of molecular formula, and excessive nitrogen, a vacancy, or the like may be present as a substance. Further, it does not exclude that other elements are contained as so-called impurities.

There is no limitation also on the kind of the eutectic oxide as long as the eutectic oxide is eutectic. Herein, the eutectic will be described. The eutectic system is a material system in which in an equilibrium diagram of a binary system of inorganic materials X and Y (materials X and Y, and the like may be compounds), there is no compound in the intermediate composition between X and Y, and the melting point is lower than the melting point of each of the materials at a certain composition ratio. At that time, the material ratio when the melting point is the lowest is referred to as the eutectic composition, and the melting point is referred to as the eutectic temperature. In addition, the eutectic system is present not only in a binary system but also in a multi-component system.

Further, in general, the composition of the eutectic point between two substances is referred to as a eutectic composition, but it has been known that in a case of performing sintering or melting by using a laser beam as in the present invention, since the speed at the time of solidification is extremely fast, the range of composition that exhibits the eutectic structure is widened. Therefore, the eutectic composition in the present invention can be defined with a certain width in around the eutectic point, and includes a composition range of ±10% from the eutectic point.

It is preferred that an oxide selected from the group consisting of oxides of respective B, Mg, Al, Si, Ca, Sc, Ti, V, Cr, Mn, Fe, Co, Ni, Cu, Zn, Ga, Ge, Sr, Y, Zr, Nb, Mo, In, Sn, Ba, Hf, Ya, W, Pb, Bi, La, Ce, Pr, Nd, Sm, Eu, Gd, Tb, Dy, Ho, Er, Tm, Yb, and Lu is contained in a constituent material of the eutectic oxide. Further, it is also preferred that a composite oxide constituted of two or more kinds of these elements is contained. In addition, from the viewpoint of using a general-purpose ceramic, it is more preferred that either aluminum oxide or zirconium oxide is contained.

From the viewpoint of improving the mechanical strength of a structure, it is preferred to add a composite oxide, and from the viewpoint of the stability of a material in a case of the eutectic oxide, it is preferred to contain a rare earth oxide. In a case where aluminum oxide is contained as the eutectic oxide, it is preferred to contain a composite oxide (compound) of aluminum oxide and a rare earth oxide in addition to the aluminum oxide. The effect of addition of the composite compound can be obtained not only in the eutectic system of two components but also in the eutectic system of three or more components. As the specific example, a system containing aluminum oxide and a composite oxide of gadolinium oxide and aluminum oxide ($GdAlO_3$), and a system containing aluminum oxide, zirconium oxide, and a composite oxide of gadolinium oxide and aluminum oxide can be mentioned.

In addition, from the viewpoint of the moldability, it is preferred to contain an absorber having capability of absorbing a laser beam, and as the composition of the absorber, $Tb_4O_7$, $Pr_6O_{11}$, and the like, which are also established as one of the materials constituting the eutectic system, can be mentioned. Further, an organic or inorganic material may be added without any limitation as long as it is a material having absorption capability even if it does not constitute a eutectic system.

Terbium oxide, which is an example of a metal oxide suitable as an absorber, will be described in detail. The terbium oxide is an oxide that can be in a variety of states, and as the representative state, states of $Tb_4O_7$ and $Tb_2O_3$ are mentioned. In the molecular formula, it is expressed as $Tb_4O_7$, but it is not limited to being exactly 4:7. In this case, the $Tb_4O_7$ is a substance constituted of $Tb^{4+}$ and $Tb^{3+}$ half and half, but the $Tb_2O_3$ is a substance constituted only of $Tb^{3+}$. The high infrared absorptivity of $Tb_4O_7$ is remarkable in the vicinity of 1070 nm of an Nd:YAG laser, and may exceed 60% and reach 70% in some cases. On the other hand, as the $Tb^{4+}$ is gradually decreased, the absorption rate becomes lowered, and in a state of $Tb_2O_3$ constituted only of $Tb^{3+}$, the absorption rate becomes around 7%. The correlation between the reduction of terbium with valence 4+ and the decrease of absorption rate is apparent. Therefore, the terbium oxide ($Tb_4O_7$) containing tetravalent terbium is preferable as an absorber for realizing the present invention, and is suitable as one composition of the inorganic material powder for additive modeling according to the present invention.

Next, specific examples of the composition will be described. As the most general-purpose ceramic, alumina ($Al_2O_3$) is known. Further, as the powder suitable for three-dimensional modeling, an alumina eutectic oxide can be mentioned. Accordingly, for each of the $Al_2O_3$—$Gd_2O_3$ system (composition ratio is $Al_2O_3$:49.1 wt %, and $Gd_2O_3$: 50.9 wt %) and the $Al_2O_3$—$Y_2O_3$ system (composition ratio is $Al_2O_3$:62.7 wt %, and $Y_2O_3$:37.3 wt %), which are alumina eutectic oxides, the establishment requirements of the present invention have been confirmed.

Figure 3:
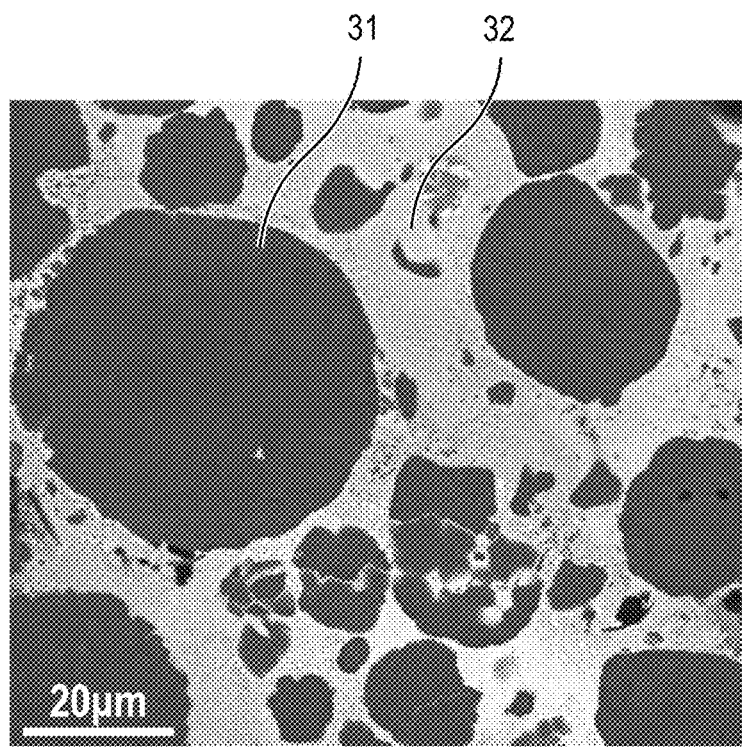
FIG. 3 is an image showing a structure of a eutectic oxide to which a nitride of the present invention is added.

As shown in FIG. 3, the structure obtained by the present invention is constituted of a nitride region 31 and a eutectic oxide region 32. In a specific example referred to herein, as the eutectic oxide region 32, $Al_2O_3$ and $GdAlO_3$ are precipitated in the $Al_2O_3$—$Gd_2O_3$ system, and $Al_2O_3$ and $YAlO_3$ are precipitated in the $Al_2O_3$—$Y_2O_3$ system. The $Al_2O_3$—$Y_2O_3$ system can be further adjusted to the composition in which $Al_2O_3$ and $Y_3Al_5O_{12}$ are precipitated.

In this regard, the eutectic structure of a eutectic oxide region (oxide region) 32 is generally referred to be in a crystalline state, but in the present invention, it includes a state in which an amorphous state occupies the part or all. If necessary, heat treatment may be performed after modeling, and recrystallization may be performed to obtain a desired structure form.

For the above composition, the average density of the $Al_2O_3$—$Gd_2O_3$ system is calculated to be around 5.72 g/cm$^3$, and the average density of the $Al_2O_3$—$Y_2O_3$ system is calculated to be around 4.28 g/cm$^3$. Note that the numerical values described here are approximate, and some numerical difference due to the difference in the calculation method is not a problem. Since the density of the $Al_2O_3$ is around 3.96 g/cm$^3$, it is apparent that the density of each of the eutectic oxides is relatively large.

In the $Al_2O_3$—$Gd_2O_3$ system, the case where the density of a structure is reduced by the addition of a nitride is a case where a nitride region 31 is constituted by any one of the h-BN, AlN, $Si_3N_4$, and TiN, each of which has a density lower than the density of the $Al_2O_3$—$Gd_2O_3$ system, among the nitrides described above. In addition, in the $Al_2O_3$—$Y_2O_3$ system, the case is a case where a nitride region 31 is constituted by any one of the h-BN, AlN, and $Si_3N_4$, each of which has a density lower than the density of the $Al_2O_3$—$Y_2O_3$ system. Further, in these eutectic oxide systems, in order to bring the density of a structure closer to the density of $Al_2O_3$, any one of the h-BN, AlN, and $Si_3N_4$, each of which has a density lower than the density of the $Al_2O_3$, may be added in any system.

From this point of view, in the addition of the nitride, it is preferred to use at least one of boron nitride, aluminum nitride, and silicon nitride. The concentration of the nitride to be added to the eutectic oxide will be described later.

Powder

Since there are multiple kinds of the particles constituting a powder, they will be described in order.

First of all, there are some cases where a powder contains particles including each composition alone. For example, there are a case where the powder is constituted of four kinds of compositions of $Al_2O_3$, $Gd_2O_3$, $Tb_4O_7$ (absorber), and AlN, and a case where $Al_2O_3$ particles, $Gd_2O_3$ particles, $Tb_4O_7$ particles, and AlN particles are present, respectively, and as a mixture thereof, the powder is constituted.

Further, there may be a case where a powder contains particles including multiple compositions. For example, in a case where the powder is constituted of four kinds of compositions of $Al_2O_3$, $Gd_2O_3$, $Tb_4O_7$, and AlN, the powder may be constituted only of one kind of particles including $Al_2O_3$—$Gd_2O_3$—$Tb_4O_7$—AlN. Alternatively, as in a case where the powder is constituted of $Al_2O_3$—$Gd_2O_3$ particles, $Tb_4O_7$ particles, and AlN particles, the powder may also be in a state in which $Al_2O_3$—$Gd_2O_3$ constitutes the same particles. In this case, it is also preferred that part or all of the $Al_2O_3$—$Gd_2O_3$ particles are constituted of $Al_2O_3$—$GdAlO_3$ particles in which $Al_2O_3$ and $Gd_2O_3$ have reacted.

When trying to constitute the powder by containing an absorber in the same particles of other compositions, there may be a case where the absorption capability is lost. Specifically, when trying to contain the $Tb_4O_7$ that is an example of an absorber in the same particles of other compositions, there may be a case where the $Tb_4O_7$ state cannot be maintained and is changed to $Tb_2O_3$. Therefore, the composition being an absorber is preferably in a situation constituting alone the particles even if other compositions are in any states.

In a similar way, when trying to constitute the same particles by a nitride with other compositions, the decomposition/reaction may be generated in the production process, and therefore, the nitride preferably constitutes alone the particles. However, there may also be a case where into the particles of a nitride, a minute amount of $Al_2O_3$, $Y_2O_3$, or the like is added as a sintering aid in the production process. Even in a case of constituting particles singly with a nitride, the state in which a sintering aid is slightly contained is acceptable.

On the other hand, in addition to what kind of compositions the powder is constituted of, the flowability is important in a scene where a powder bed layer is formed by a powder bed fusion method using a recoater, or in a scene where the powder is ejected from a nozzle in a cladding method. When the particle has a spherical shape, sufficient flowability can be easily ensured, and this is preferred. Accordingly, it is preferred to adjust the shape of each particle so that the proportion of the powder of spherical particles exceeds 60% to the whole powder. However, as long as the above-described flowability index is satisfied, the shape is not essential to be a spherical shape.

In addition, the powder may be selected from various kinds of powders having an average particle diameter in the range of 1 μm or more and 500 μm or less, and preferably 1 μm or more and 100 μm or less. When the average particle diameter is 1 μm or more and 500 μm or less, the aggregation of particles at the time of forming a powder layer is suppressed, a layer with fewer defects is easily formed, and the melting can be efficiently performed by irradiation with a laser beam.

In addition to the above point of view, in order to reduce the density of a structure by adding the nitride, it is important that the nitride region in the structure maintains the characteristics as the nitride. Therefore, the average diameter in the nitride region in a structure is preferably 5 μm or more. Since the modeling is performed at a temperature of less than or equal to the decomposition temperature of the nitride, the nitride particles are present in a structure substantially as they are, and therefore, the average particle diameter of the nitride particles is preferably 5 μm or more, and further the shape of each nitride particle is preferably a spherical shape. However, in a case of a layered material of h-BN or the like, the sliding is favorable even in a flaky state, and therefore, the layered material may be used as it is. For the reasons described above, the average particle diameter of the nitride particles is preferably 5 μm or more and 500μ or less, and more preferably 5 μm or more and 100 μm or less.

If a structure is obtained by modeling with the use of a powder containing such a nitride, in which the nitride exists in a eutectic oxide, the density of the structure is lowered, and the present invention is established. In particular, it is preferred that the polycrystalline body of a nitride region in a structure, having an average diameter of around 5 μm remains. In this way, the properties inherent in the nitride are easily maintained. Herein, the average diameter of the nitride region in a structure can be calculated by obtaining an image in a cross section of a structure with an area of 100 μm×100 μm or more, and then by analyzing the obtained image with the use of image processing software (trade name: MATLAB) manufactured by MathWorks, Inc.

The nitride has physical characteristics that are higher thermal conductivity and lower coefficient of thermal expansion as compared with those of an oxide. A structure including only an oxide system may be chipped or may have microcracks due to thermal stress, but when the structure contains a nitride, the thermal shock resistance becomes favorable, and thus the strength and obtained quality of the structure are improved. Therefore, in the present invention, it is preferred to add even a nitride that does not contribute to the density reduction in expectation of the effect described above.

In order to uniformly melt the powder in a laser irradiation portion, a state in which at least two or more absorber particles are contained within the laser focal spot size is more preferred. The spacing between particles of the absorber is preferably 100 μm or less, and more preferably 50 μm or less. In addition, it is also preferred to adjust the laser focal spot size so that such a situation can be realized. From the viewpoint of the modeling accuracy, when it is assumed that the upper limit of the laser focal spot size is 100 μm, the particle diameter of the absorber is preferably 1 μm or more and 10 μm or less. In addition, from the viewpoint of the dispersibility of the absorber in a powder and the high packing density, the particle diameter of the absorber is preferably a relatively fine particle diameter. Therefore, the particle diameter (particle size) of the composition constituting the absorber is preferably ⅕ or less of the average particle diameter of the composition having the largest average particle diameter, which constitutes other composition groups. As described above, the particle diameter of the absorber is preferably 1 μm or more and 10 μm or less, and therefore, it is important that the particle diameter of the composition other than the absorber is 5 μm or more, and that the above-described conditions are satisfied.

In the inorganic material powder for ceramic modeling in the present invention, the composition and particle constitution of the eutectic oxide, nitride, and absorber have been described, and the crystallinity of these powders is not limited. The powder may be all crystals, may be all amorphous, or may be a mixture of crystals and amorphous. In addition, the composition is not necessary to completely match between the powder and the structure, and there may be a difference particularly in the oxidation state, the nitriding state, or the like. Therefore, in the present invention, it is also acceptable to control the atmosphere during a laser process.

In particular, it is preferred to accept not only the atmospheric state but also the inactive state of nitrogen or other rare gas atmosphere, the state in which reduction is easy due to partial hydrogen content or reduced pressure, or further the oxygen atmosphere. Due to such an atmosphere control, it does not exclude that a composition in a partially metallic state is contained as an inorganic material powder to be a raw material.

As the constitution of a structure, a state in which a nitride exists while a eutectic oxide forms a eutectic structure is preferred, but a state in which a nitride exists in an oxide including an amorphous state may be accepted. In addition, an oxynitride may be formed at the interface between the nitride and the oxide, and the oxynitride may be generated alone in the nitride region or in the eutectic oxide region.

Reduction of Density of Structure by Addition of Nitride

For each of the $Al_2O_3$—$Gd_2O_3$ system (composition ratio is $Al_2O_3$:49.1 wt %, and $Gd_2O_3$:50.9 wt %) and the $Al_2O_3$—$Y_2O_3$ system (composition ratio is $Al_2O_3$:62.7 wt %, and $Y_2O_3$:37.3 wt %), the requirements for obtaining the effect of the present invention were confirmed. These eutectic powders are systems in which as the eutectic structure after the modeling, $Al_2O_3$ and $GdAlO_3$ are precipitated in the $Al_2O_3$—$Gd_2O_3$ system, and $Al_2O_3$ and $YAlO_3$ are precipitated in the $Al_2O_3$—$Y_2O_3$ system.

For the above composition, the average density of the $Al_2O_3$—$Gd_2O_3$ system is calculated to be around 5.72 $g/cm^3$, and the average density of the $Al_2O_3$—$Y_2O_3$ system is calculated to be around 4.28 $g/cm^3$. Note that the numerical values described here are approximate, and some numerical difference is acceptable.

Herein, since the density of the alumina ($Al_2O_3$) is around 3.96 $g/cm^3$, it is apparent that the density of the eutectic oxide becomes relatively large.

In the present invention, a nitride that exerts the effect of reducing the density of the structure obtained from a eutectic powder is added. In the $Al_2O_3$—$Gd_2O_3$ system, at least one kind of nitride selected from the group consisting of h-BN, AlN, $Si_3N_4$, and TiN may be added, and in the $Al_2O_3$—$Y_2O_3$ system, at least one kind of nitride selected from the group consisting of h-BN, AlN, and $Si_3N_4$ may be added. In order to bring the density of the structure closer to the density of $Al_2O_3$, one or more kinds of nitrides selected from the group consisting of h-BN, AlN, and $Si_3N_4$, each of which has a density smaller than the density of $Al_2O_3$, may be added in any system.

With the combination as described above, it has been confirmed that the powder mixture obtained by adjusting the powder of a eutectic oxide and the powder of a nitride at a desired ratio can form a powder layer (powder spreading and leveling) in the powder bed fusion method. This is also because favorable flowability was obtained by adjusting the proportion of the powder in a spherical shape to be exceeding 60% to the whole powder.

From the above, in order to obtain the effect of the present invention, it is necessary to add a nitride having a density lower than the average density of the eutectic oxide. In addition, preferably, a nitride having a density lower than that of $Al_2O_3$, specifically, h-BN, AlN, and $Si_3N_4$ are preferred. Even when these nitrides are mixed, a powder exhibiting the flowability suitable for a powder bed fusion method can be prepared.

Density of Structure

The relationship between the density of a structure modeled by using a powder for additive modeling that contains a eutectic oxide and a nitride having a density smaller than the average density of the eutectic oxide, and the proportion of the nitride contained in the powder was confirmed.

Specifically, the density of a structure obtained from a powder in which the mixing ratio of an $Al_2O_3$—$Gd_2O_3$ system (composition ratio is $Al_2O_3$:49.1 wt %, and $Gd_2O_3$: 50.9 wt %) to any one of the h-BN, AlN, and $Si_3N_4$ had been changed was calculated. The density of a structure was calculated from the weight ratio of the eutectic oxide to the nitride on the premise that the composition does not change between the powder and the structure. The results are shown in Table 1.

In a case where $Tb_4O_7$ is partially added as an absorber, the Gd site is partly substituted with Tb in the obtained structure, but Gd and Tb are elements having atomic numbers adjacent to each other, the density change is minor. Therefore, the density can be regarded as equivalent to the density of the structure obtained from the powder to which $Tb_4O_7$ has not been added.

TABLE 1

| Weight ratio of eutectic oxide:nitride | h-BN Density g/cm³ | h-BN Relative density % | AlN Density g/cm³ | AlN Relative density % | $Si_3N_4$ Density g/cm³ | $Si_3N_4$ Relative density % |
|---|---|---|---|---|---|---|
| 10:1 | 5.03 | 87.9 | 5.35 | 93.5 | 5.39 | 94.2 |
| 10:3 | 4.23 | 74 | 4.87 | 85.1 | 4.96 | 86.7 |
| 1:1 | 3.25 | 56.8 | 4.15 | 72.6 | 4.3 | 75.2 |
| 3:10 | 2.64 | 46.2 | 3.62 | 63.3 | 3.79 | 66.3 |

As shown in Table 1, for the aluminum oxide (density: 3.96 g/cm³), the density becomes a relatively closer value at 10:3 when h-BN is added, and when the ratio is 1:1 or more, the weight reduction can be attained. With the AlN addition, the density is larger by around 20% at 10:3, but there is a possibility that the equivalence can be achieved on a weight basis by lightening in additive modeling and applying a lattice structure. In addition, the equivalence can be attained at 1:1, and the further weight reduction can be attained at 3:10. $Si_3N_4$ and AlN behave similarly to each other, and can obtain the effects similar to each other. The relative density in Table 1 is for the case only of a eutectic oxide (case of not containing a nitride), and becomes an index of the weight reduction.

As described above, the density of a structure can be controlled with the amount of the nitride to be added. In this regard, with the addition amount of exceeding 3:10 in AlN, there may be a case of reaching a situation in which the porous forming is accelerated. In addition, even in a case of obtaining a porous structure, at least around 10% by volume of a eutectic oxide is necessary for maintaining a three-dimensional structure, and therefore, the eutectic oxide at a ratio of around 0.8:5 is necessary to be present. The volume ratio of the eutectic oxide to the nitride is preferably 0.15 or more and 6.01 or less, and more preferably 0.2 or more and 2.0 or less.

Relationship Between Eutectic Temperature and Decomposition of Nitride

When the temperature of an irradiation portion of a laser beam exceeds 1900° C., there may be a case where the decomposition of a nitride such as h-BN, AlN, or $Si_3N_4$ affects the modeling. In addition, in order to maintain the properties inherent in the nitride, it is preferred to use a eutectic oxide having a melting point of less than or equal to the decomposition temperature of the nitride to be added, and further it is preferred that the eutectic oxide is present in substantially the same state as the nitride particles added to the powder in a structure. For example, the melting point of an $Al_2O_3$—$Gd_2O_3$ eutectic system is around 1720° C., the melting point of an $Al_2O_3$—$Y_2O_3$ eutectic system is around 1820° C., and both of the melting points are preferred because of being lower than the above-described decomposition temperature of the nitride. In order to further suppress the decomposition of the nitride, it is preferred to further lower the melting point of the eutectic oxide. For example, by using a ternary eutectic system of $Al_2O_3$—$Gd_2O_3$—$ZrO_2$ (three kinds of $Al_2O_3$, $GdAlO_3$, and $ZrO_2$, or the like can be used as the eutectic structure), the melting point can be lowered to 1700° C. or less.

Structure and Method of Producing the Same

A structure including an inorganic material, which is obtained according to the present invention, is constituted of polycrystalline nitride particles having an average diameter of 5 μm or more, and an oxide region forming a eutectic structure filling between the above-described nitride particles (surrounding the nitride, hereinafter also referred to as "matrix part"). The nitride particle contains at least one kind of aluminum nitride, silicon nitride, and boron nitride, the oxide region is a eutectic structure containing aluminum oxide, and a compound of a rare earth oxide and aluminum oxide. In this regard, either the nitride particle or the oxide region may include an oxynitride.

Next, specific examples of the method of producing a structure will be described. This production method includes: a step of preparing a powder containing particles of a eutectic oxide and nitride particles having an average particle diameter (average particle size) of 5 μm or more; a step of constituting a powder layer having a thickness of 5 μm or more by an additive modeling device to which a powder bed fusion method can be applied; and a step of melting and solidifying at least part of the powder layer at a temperature of less than or equal to the decomposition temperature of the nitride by irradiation with a laser beam. Until the desired structure is obtained, a step of constituting a powder layer, and a step of melting and solidifying the powder by irradiating the powder layer with a laser beam according to a shape of a three-dimensional model, are repeated to perform modeling.

Semiconductor Production Device Component and Semiconductor Production Device, Using Structure of the Present Invention As an example of the semiconductor production device component using the structure of the present invention, a supporting table of a wafer chuck in a semiconductor exposure device having a hollow structure can be mentioned. The supporting table of a wafer chuck is a ceramic component including a water-cooling flow path for maintaining the temperature stability and an air flow path for the wafer chuck mechanism, and is made of SiC or $Al_2O_3$ in many cases.

Figure 4:
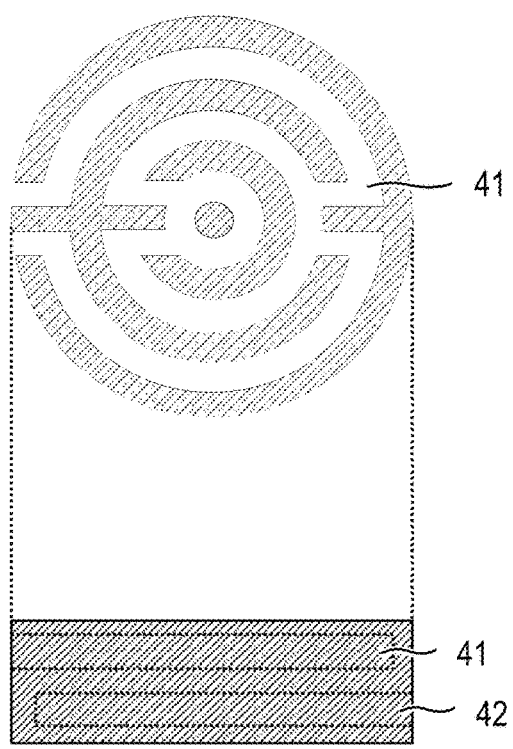
FIG. 4 is a diagram showing an example of a component that can be modeled using the powder according to the present invention.

In FIG. 4, a schematic shape of the three-dimensional model of a supporting table of a wafer chuck is shown. As shown in FIG. 4, there is hollow part in a structure. As such a hollow flow path, with regard to the moldability of a complicated component including multiple system paths of a water-cooling flow path 41, an air flow path 42, and the like a three-dimensional model can be prepared with an additive modeling technique without regard to the complexity if there is shape data of the three-dimensional model, and the design change is also easy, and therefore, it can be said to be the most powerful measure. The flow paths can be freely arranged, and with respect to the cross-sectional shape of the hollow part, a shape in consideration of the modeling stability is preferably adopted. For example, it is also preferred to be a vertically long rhomboid. In this regard, the supporting table of a wafer chuck has holes for communicating the air flow path 42 and the adsorption face, but these are not shown in FIG. 4.

A semiconductor exposure device as an example of the semiconductor production device on which a wafer chuck supporting table having such a hollow flow path has been mounted can be realized by combining a wafer chuck, a slider, a slider drive system (gas/electric system), a light source, an optical system, a control system, and the like.

EXAMPLE 1

In the present Example, by using a powder containing a eutectic oxide and a nitride having a density lower than that of the eutectic oxide, a structure was prepared by changing the modeling conditions.

At first, as a powder of a eutectic oxide, a powder including a composition in which part of the $Gd_2O_3$ of an $Al_2O_3$—$Gd_2O_3$ eutectic system had been changed to $Tb_4O_7$ was prepared. Specifically, an $Al_2O_3$—$Gd_2O_3$ system powder including $Al_2O_3$:49.1 wt %, $Gd_2O_3$:46.7 wt %, and $Tb_4O_7$:4.2 wt % as the composition ratio of the powder, which has a median value of around 30 μm, and a $Tb_4O_7$ powder having a median value of around 3 μm were used. The $Tb_4O_7$ has high absorption capability for the wavelength of a YAG laser, and therefore, by adding the $Tb_4O_7$, a laser beam is efficiently absorbed, and the modeling accuracy due to a laser process can be maintained. The composition ratio was set to be $Al_2O_3$:49.1 wt %, $Gd_2O_3$:46.7 wt %, and $Tb_4O_7$:4.2 wt %. Herein, Gd and Tb are adjacent to each other on the periodic table, and do not give a large change to the values of the density and melting point in Examples of the present invention.

The structure according to Example 1 was modeled by using a powder in which 1 g of AlN had been mixed to 10 g of the composition of the above-described eutectic oxide. As the powder of AlN, a powder having a median value of sintered particle diameter of around 30 μm was used. For the modeling, ProX DMP 100 (trade name) manufactured by 3D systems Corporation was used, and the powder layer thicknesses was set to be 20 μm, the laser power was set to be 20 W, and the scan speed was set to be 100 mm/s. A structure having a size of 6×6 mm and a thickness of around 0.5 mm was produced at each of the scan pitches of 70, 100, 130, and 160 μm.

In a case of a pitch of 70 μm, the input heat quantity was large and the structure was collapsed, but in cases of other pitches of 100 and 160 μm, a structure having almost the same size as the designed size was obtained, and with the addition of AlN, the effect of the absorber was not inhibited, and the appearance was favorable with less unevenness on the surface.

From this result, under the condition of a scan pitch of 70 μm, it is assumed that the nitride has reached the decomposition point. In addition, when the cross section of the structure that had been able to be prepared according to the designed size was observed with a scanning electron microscope (SEM), it was able to be confirmed that AlN in a spherical shape was present inside the molten eutectic oxide.

From the results described above, it was able to be confirmed that by using a powder containing a eutectic oxide and a nitride having a density lower than that of the eutectic oxide, when the modeling is performed by a powder bed fusion method so that the temperature of an irradiation portion of a laser beam becomes a temperature of less than or equal to the decomposition temperature of the nitride, a structure including the eutectic oxide and the nitride is obtained.

EXAMPLE 2

The present Example relates to the presence or absence of a difference depending on the kind of the nitride and the detailed structural observation, for the situation in which the nitride of the present invention exists in the eutectic oxide.

A sample in which as eutectic oxide, a eutectic oxide similar to that in Example 1 was used, and the mixing ratio of the eutectic oxide to the nitride was changed as shown in Table 2 was prepared. A sample, which was modeled by using a device similar to that in Example 1 and under the same conditions as those in Example 1 and was kept the shape, was used for evaluation. In addition, a sample modeled without adding a nitride to the powder was used in Comparative Example 1.

TABLE 2

| | Weight ratio of eutectic oxide:nitride | Density [g/cm$^3$] | Before addition Density ratio [%] |
|---|---|---|---|
| Comparative Example 1 | 10:0 | 5.72 | 100 |
| Present invention 1 | 10:1 | 5.35 | 93.5 |
| Present invention 2 | 10:3 | 4.87 | 85.1 |
| Present invention 3 | 1:1 | 4.15 | 72.6 |
| Present invention 4 | 3:10 | 3.62 | 63.3 |

In Table 2, in the present invention 2, a eutectic oxide powder was used in a similar manner as in the present invention 1; in the present invention 3, a powder in a mixed state of 3 kinds of $Al_2O_3$ (median value of around 20 μm), $Gd_2O_3$ (median value of around 30 μm), and $Tb_4O_7$ (median value of 3 μm) was used; and in the present invention 4, a powder in a mixed state of 3 kinds of $Al_2O_3$ (median value of around 3 μm), $Gd_2O_3$ (median value of around 3 μm), and $Tb_4O_7$ (median value of 3 μm) was used. For the AlN, a powder similar to that in the present invention 1 (median value of around 30 μm) was used in any case. In any one of the powders, the proportion of the flowable spherical particles is taken into consideration so that a powder layer can be constituted as in Example 1.

At any ratio, in the structure, the AlN particles remained so as to be surrounded by the eutectic oxide, and it was able to be observed by an optical microscope that there was a situation in which the effect of the present invention is obtained. In addition, the situation of the powder of a eutectic oxide was changed in 3 kinds, but in any case, it was able to obtain a state in which the AlN remained.

Further, in order to observe the structure of the present invention 4 in detail, observation was performed with a scanning electron microscope (SEM) from the cross-section direction of the sample. The SEM image of the cross-section direction of the sample is shown in FIG. 3. As shown in FIG. 3, it was confirmed that there is a situation in which a eutectic oxide region 32 is a eutectic structure region of $Al_2O_3$ and $GdAlO_3$ (light gray), a nitride region 31 is an AlN particle, and particularly polycrystalline particles (dark grey) are scattered (so-called sea-island structure). It was revealed that in the AlN polycrystalline particles, particles of from the average of the SEM images to 5 μm or more exist. In order to obtain the effect of the present invention, it is not necessarily essential to exist as polycrystalline particles, but the polycrystalline particles were shown as an example of a preferred state.

From the above, regardless of the amount of the nitride to be added, and also regardless of the powder state of the eutectic oxide, a structure that was relatively low densified was obtained, and it was able to be confirmed that the structure can be adjusted to a desired density.

EXAMPLE 3

The present Example relates to the fact that a structure low densified by adding the nitride of the present invention can constitute a component and a device.

Under the condition of the present invention 2 in the previous Example 2, as an example, the modeling of simulating a supporting table of a wafer chuck in a semiconductor exposure device was attempted.

Formally, if it corresponds to a 300 mm wafer, the size is around ϕ400 mm, but due to the limitations of the device used for modeling (the same modeling device as in Example 2), the reduced model was modeled. As shown in FIG. 4, a component shape having a diameter of ϕ46 mm, inside which two systems of flow paths of a water-cooling flow path 41 and an air flow path 42 were present, was obtained. The cross-sectional shape of the flow path was set to be a vertically long rhomboid in any case. In the top view of FIG. 4, only the system of the water-cooling flow path 41 is shown. In addition, holes for communicating the chuck face and the air flow path 42, which are not shown in FIG. 4, have no difficulty in modeling, and therefore, the modeling was omitted.

Further, the density of a structure to be obtained under the conditions of the present invention 2 is around 4.87 g/cm$^3$, and is higher than that of a structure made of alumina in the same shape. In such a case, while maintaining the strength required for the structure, by using a technique of the aggressive lightening, the adoption of a lattice structure, or the like, which is difficult to be performed by machining and is the feature of three-dimensional modeling, the volume can be reduced as compared to the conventional one. Therefore, it is also possible to reduce the weight of components as the whole structure, and to realize a weight equivalent to that of a conventional component (density of around 3.96 g/cm$^3$) made of $Al_2O_3$.

A semiconductor exposure device on which a wafer chuck supporting table having such a hollow flow path is mounted can be realized by combining a wafer chuck, a slider, a slider drive system (machine/electric system), a light source, an optical system, a control system, and the like.

With the powder for additive modeling according to the present invention, favorable moldability is obtained in the modeling by a powder bed fusion method, or an additive modeling method such as a cladding method, and the powder can be applied to production of a ceramic component in the field where weight reduction is desired, by taking advantage of the characteristic of lowering the density of a structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A structure, comprising a nitride region having an average diameter of 5 μm to 100 μm, and an oxide region forming a eutectic structure,
   wherein the eutectic structure contains aluminum oxide, and a compound of a rare earth oxide and aluminum oxide.

2. The structure according to claim 1, wherein the nitride region includes at least one selected from the group consisting of aluminum nitride, silicon nitride, and boron nitride.

3. The structure according to claim 1, wherein either the nitride region or the oxide region includes an oxynitride.

4. A semiconductor production device component, comprising the structure according to claim 1, wherein the structure has a hollow part therein.

5. A semiconductor production device, comprising the semiconductor production device component according to claim 4.

6. The structure according to claim 1, wherein a density of the nitride region is lower than an average density of the oxide region.

7. The structure according to claim 1, wherein the oxide region contains aluminum and gadolinium and the nitride region contains at least one selected the group consisting of boron nitride, aluminum nitride, silicon nitride, and titanium nitride.

8. The structure according to claim 1, wherein the oxide region contains aluminum and yttrium and the nitride region contains at least one selected the group consisting of boron nitride, aluminum nitride, and silicon nitride.

9. The structure according to claim 1, wherein the oxide region contains aluminum, gadolinium and zirconium and the nitride region contains at least one selected the group consisting of boron nitride, aluminum nitride, and silicon nitride.

10. The structure according to claim 1, wherein a volume ratio of the oxide region to the structure is 13.0 vol % to 85.7 vol %.

11. The structure according to claim 7, wherein the oxide region contains a eutectic structure consisting of $Al_2O_3$ and $GdAlO_3$.

12. The structure according to claim 8, wherein the nitride region comprises at least one selected from the group consisting of h-BN, AlN, and $Si_3N_4$, and the oxide region comprises a eutectic structure consisting of $Al_2O_3$ and $YAlO_3$.

* * * * *